(12) United States Patent
Chen et al.

(10) Patent No.: US 7,026,275 B2
(45) Date of Patent: Apr. 11, 2006

(54) METHOD OF REDUCING PHOTOELECTRIC DEVICE LEAKAGE CURRENT IN CONJUGATED POLYMER AND CONJUGATED POLYMER COMPOSITION

(75) Inventors: Kuo-Yu Chen, Changhua (TW);
Chi-Shen Tuan, Hsinchu (TW);
Wan-Jung Teng, Hsinchu (TW);
Shinn-Jen Chang, Hsinchu (TW)

(73) Assignee: Industrial Technology Research Institute, (TW)

( * ) Notice: Subject to any disclaimer, the term of this patent is extended or adjusted under 35 U.S.C. 154(b) by 241 days.

(21) Appl. No.: 10/633,708

(22) Filed: Aug. 5, 2003

(65) Prior Publication Data

US 2004/0250849 A1    Dec. 16, 2004

(30) Foreign Application Priority Data

Jun. 11, 2003    (TW) ............................... 92115804 A (51) Int. Cl.
*C11D 9/04*    (2006.01)
*C08F 112/08*    (2006.01)

(52) U.S. Cl. ..................... 510/175; 510/178; 526/246; 136/263; 136/254; 136/261

(58) Field of Classification Search ................ 526/346; 510/175, 178; 136/263, 254, 261
See application file for complete search history.

(56) References Cited

U.S. PATENT DOCUMENTS

2003/0215669 A1 *   11/2003   Kathirgamanathan et al. ... 428/690

* cited by examiner

*Primary Examiner*—Ling-Sui Choi
(74) *Attorney, Agent, or Firm*—Sughrue Mion, PLLC (57) ABSTRACT

A method of reducing the photoelectric device leakage current caused by residual metal ions in conjugated polymer. A chelating agent is added to a conjugated polymer material, thereby the conductivity and mobility of metal ions under an electric field are reduced due to the chelation of metal ions by the chelating agent; therefore, the leakage current is reduced and the stability of devices is improved. Furthermore, the activity of metal ions is reduced after the metal ions are chelated by the chelating agent, improving the stability of the material and the devices. A conjugated polymer composition is also provided.

8 Claims, 10 Drawing Sheets

METHOD OF REDUCING PHOTOELECTRIC DEVICE LEAKAGE CURRENT IN CONJUGATED POLYMER AND CONJUGATED POLYMER COMPOSITION

BACKGROUND OF THE INVENTION

1. Field of the Invention

The present invention relates to a method of reducing photoelectric device leakage current caused by residual metal ions in conjugated polymer. The present invention also relates to a conjugated polymer composition.

2. Description of the Related Art

Conjugated polymer material is used widely in organic photoelectric devices, such as polymeric light emitting diodes, organic solar cells, organic transistors and the like. The purity of the conjugated polymer material is critical to the photoelectric properties of the devices. However, there are many contamination sources, including the catalysts, reactants, and containers used in the synthesis of conjugated polymers and the environment. Purification of conjugated polymer is difficult, therefore, after purification, residual metal ions may remain. When an electric field is applied to a device comprising conjugated polymer, leakage current occurs due to the residual metal ions, reducing device efficiency. A further reaction or oxidation of conjugated polymer material is possible due to residual metal ions, thus material stability is lowered and may lead to device failure. Therefore, a method of solving the problem of photoelectric device leakage current caused by residual metal ions in conjugated polymer is called for.

U.S. Pat. No. 6,255,450 discloses a method to deaggregate electrically conducting polymer precursor molecules by the addition of surfactants, crown ethers, metal chelates, or ionic complexing agents thereto, so that dopants added thereafter can distribute uniformly in the polymer precursors to increase the electrical conductivity. It does not disclose the problem caused by residual metal ions and the method of the resolution.

SUMMARY OF THE INVENTION

In view of the disadvantage of the prior art mentioned above, an object of the invention is to provide a method of reducing photoelectric device leakage current caused by residual metal ions in conjugated polymer, which can reduce the leakage current in photoelectric devices and improve the stability.

Another object of the invention is to provide a conjugated polymer composition, which is highly stable and reduces leakage current in photoelectric devices comprising said composition.

To achieve the objects mentioned above, the method of reducing photoelectric device leakage current caused by residual metal ions in conjugated polymer comprises the following steps. First, a conjugated polymer material or a precursor thereof for a photoelectric device is provided. Next, the conjugated polymer material or precursor, a chelating agent in an amount of 0.01 to 50 wt % based on the weight of the conjugated polymer material or precursor, and a solvent are formed into a solution. In the solution the residual metal ions originally contained in the conjugated polymer material or the precursor thereof are chelated by the chelating agent. Then, the resulting solution is formed into a film for the photoelectric device.

The conjugated polymer composition of the present invention comprises at least a conjugated polymer or a precursor thereof and a chelating agent in an amount of 0.01 to 50 wt % based on the weight of the conjugated polymer material or the precursor thereof.

In the present invention, the residual metal ions in the conjugated polymer material or the precursor thereof are chelated with a chelating agent, that is, the metal ions are captured by the chelating agent, therefore, the conductivity and mobility of the residual metal ions in an electric field are decreased, and in turn, the leakage current is reduced, allowing the device to have good stability. Furthermore, when the metal ions are chelated by a chelating agent, the activity of metal ions is decreased, avoiding a further reaction or oxidation of conjugated polymer material and thus increasing the stability of the material.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The method of reducing photoelectric device leakage current caused by residual metal ions in conjugated polymer is accomplished by dissolving a chelating agent and a conjugated polymer or a precursor thereof in a solvent or mixed solvents, so that the chelating agent chelates with the residual metal ions in the conjugated polymer or a precursor thereof to reduce the electric conductivity and mobility of the metal ions, thereby reducing the device leakage current and improving the stability of the device. Furthermore, after chelating agent chelates with metal ions, the activity of metal ions is reduced, and this also improves the stability of the material and the device.

The method of the present invention comprises the following steps.

First, a conjugated polymer material or a precursor thereof for photoelectric device is provided. Suitable conjugated polymer material or precursor thereof is an organic light emitting polymer material, an electron transferring polymer material, or a hole transferring polymer material used in photoelectric devices. The examples include but are not limited to polyaniline and derivatives thereof, polythiophene and derivatives thereof, polypyrrole and derivatives thereof, polyphenylene and derivatives thereof, polyphenylene vinylene and derivatives thereof, polypyrene and derivatives thereof, polyfluorene and derivatives thereof, polypyridine and derivatives thereof, polyquinodiazole and derivatives thereof, PEDOT (i.e. poly(ethylenedioxythiophene)), and precursors of the polymer mentioned above. Among them, Polyphenylene vinylene (with a preferred molecular weight between 10,000 and 2,000,000), polyfluorene (with a preferred molecular weight between 10,000 and 1,000,000), precursors, derivatives and combinations thereof are preferred. "Derivative" referred herein means a polymer main chain having substituent side chains, such as, but not limited to, alkyl group, alkoxy group, phenyl group, phenoxy group, heterocyclic group, cyano group, halogen atom, trifluoromethyl group, silyl group, and the like.

Next, the conjugated polymer material or the precursor thereof, a chelating agent in an amount of 0.01 to 50 wt % based on the weight of the conjugated polymer material or the precursor thereof, and an appropriate amount of solvent or solvents are formed into a solution. In the solution, the residual metal ions originally contained in the conjugated polymer material or the precursor thereof are chelated by the chelating agent. "Chelating agent" means the substance having the ability to chelate with metal ions, for example, 1,3-diketones (such as acetylacetone, trifluoroacetylacetone and thenoyltrifluoroacetone), polyphosphates (such as sodium triphosphate and hexametaphosphoric acid), phosphoric acids (such as nitrilotrimethylenephosphonic acid, ethylenediaminetetra(methylenephosphonic acid) and hydroxyethylidenediphosphoric acid), aminocarboxylic acids (such as ethylenediaminetetraacetic acid, hydroxyethylethylenediaminetriacetic acid, nitrilotriacetic acid, N-dihydroxyethylglycine and ethyldihydroxyphenylglycine), hydroxycarboxylic acids (such as tartaric acid, citric acid, gluconic acid, and 5-sulfosalicylic acid), polyamines (such as ethylenediamine and triethylenetetramine), aminoalcohols (such as triethanolamine and N-hydroxyethylethylenediamine), aromatic heterocyclic bases (such as dipyridyl and phenanthroline), phenols (such as salicylaldehyde, disulfopyrocatechol, and chromotropic acid), aminophenols (such as 8-hydroxyquinoline and oxinesulfonic acid), oximes (such as dimethylglyoxime and salicylaldoxime), salicylimines (such as N,N'-bis(salicylidene)ethylenediamine), Schiff bases (such as disalicylaldehyde 1,2-propylenediimine), tetrapyrroles (such as tetraphenylporphin and phthalocyanine), sulfur compounds (such as tetramethylthiuram disulfide, dithiol, 2,3-dimercaptopropanol, thioglycolic acid, potassium ethyl xanthate, sodium diethyldithiocarbamate, dithizone, diethyl dithiophosphoric acid and thiourea), crown ethers (such as 12-crown-4, 15-crown-5, 18-crown-6 and dibenzo-18-crown-6), triazole derivatives (such as Ciba® Irgamet® 30, Ciba® Irgamet® 39, Ciba® Irgamet® 42, Ciba® Irgamet® BTA M, Ciba® Irgamet® SBT 75 and Ciba® Irgamet® TTA), polymers (such as polyethylenimine, polymethacryloylacetone, poly(p-vinylbenzyliminodiacetic acid)), and the like. Among them, 8-hydroxyquinoline, oxinesulfonic acid, tetraethylthiuram disulfide, tetramethylthiuram disulfide, dithiol, 2,3-dimercaptopropanol, thioglycolic acid, potassium ethyl xanthate, sodium diethyldithiocarbamate, dithizone, diethyl dithiophosphoric acid, thiourea, 12-crown-4, 15-crown-5, 18-crown-6 and dibenzo-18-crown-6, N,N'-bis(salicylidene) ethylenediamine, and combinations thereof are preferred. The amount of chelating agent used depends on the amount of residual metal ions in the conjugated polymer material or the precursor thereof, and may be from 0.01 to 50 wt %, preferred from 0.05 to 30 wt %, and more preferred from 0.1 to 15 wt %, based on the weight of the conjugated polymer material or the precursor thereof.

The solvent used in the present invention is not particularly specific and can be any solvent which does not deteriorate the conjugated polymer material or the precursor thereof and the chelating agent. The solvent used may be non-polar or low-polar single solvent or co-solvent, for example, aromatic hydrocarbons, such as toluene, xylene, ethylbenzene, dimethylbenzene, diethylbenzene, dibutylbenzene, cymene, propyl benzene, mesitylene, trimethylbenzene, tetralin, tetramethylbenzene and dodecylbenzene; benzene derivatives having halogen atom, such as chlorobezene, dichlorobezene, and trichlorobezene; benzene derivatives having an alkoxy group, such as anisole and phenetole; heterocyclic derivatives having a nitrogen atom, such as pyridine, methylpyridine, piperidine, methylpiperidine, dimethyl piperidine, ethylpiperidine, pyrrolidine, methylpyrrolidine and Pyrrole; furan derivatives, such as tetrahydrofuran, methyl tetrahydrofuran, dimethyltetrahydrofuran, dimethoxytetrahydrofuran, tetramethyltetrahydrofuran and tetrahydropyran; alicyclic saturated ketones, such as cyclohexanone; two or more solvents mentioned above as a co-solvent and the like. The solubility ranges from 1 mg/cc to 100 mg/cc.

The useful solvent may be polar single solvent or co-solvent, for example, water, water compatible alcohols (such as methanol and ethanol), organic solvent (such as N,N-dimethylformamide, N-methylpyrrolidone, dimethylimidazoline, dimethyl sulfoxide), two or more solvents mentioned above as a co-solvent; and the like. The solubility ranges from 1 mg/cc to 100 mg/cc.

In the method of the present invention, the addition of chelating agents can be performed after the conjugated polymer is polymerized. Metal ions from catalysts and other contamination sources often remain in the conjugated polymer used for photoelectric devices, because the purification of the conjugated polymer after synthesis is difficult due to its high molecular weight. By the method of the present invention, a chelating agent is added to chelate with metal ions, where more chelating agent is added when the metal ion content is higher, and where less is added when the metal ion content is lower, to achieve the object of the present invention. When the conjugated polymer is provided in precursor form, the addition of the chelating agent can also be performed to chelate with residual metal ions after the precursor of conjugated polymer is formed.

Then, the resulting solution containing the conjugated polymer or the precursors thereof and the chelating agent is formed into a film used for the photoelectric device. For example, the solution can be formed into a film on an electric conductive glass, plate, or plastic film by the process of ink-jet printing, spin coating, surface coating, dipping, screen printing, or micro contact, and then a metal or indium tin oxide film is vapor deposited on the film to function as an electrode, to manufacture an organic diode light emitting device. The solution can be formulated into an electron or hole transferring semiconductor ink and then S formed into a double layers of film on electric conductive glass, a plate, or a plastic film by the process of ink-jet printing, spin coating, surface coating, dipping, screen printing, or micro contact, and then a metal or indium tin oxide film is vapor deposited on the film to function as an electrode, to manufacture an organic solar cell device. The solution can be formulated into an electron or hole transferring semiconductor ink and then formed into a film on an dielectric layer such as silicon dioxide, silicon nitride, polyimide, polyvinylphenol and acrylic resin layer by a process of ink-jet printing, spin coating, surface coating, dipping, screen printing, or micro contact, and then metal layers (for gate, source, and drain electrodes) are deposited on the dielectric layer and the semiconductor layer, to manufacture an organic transistor device. The solution can be formulated into an electron or hole transferring semiconductor ink and then coated on a metal film such as Al, Mg, Au, Cr, Fe, Zn, Ag, Ni, Cu, Pd and the like by the process of ink-jet printing, spin coating, surface coating, dipping, screen printing, or micro contact, and then the above process is repeated to form a multilayer structure, to manufacture an organic laser, organic memory, organic resistor, organic capacitor, or organic inductor. The photoelectric device manufactured by the method of the present invention has lower leakage current, higher rectification ratio, more stable electric properties and longer life than those in the conventional photoelectric device without the addition of a chelating agent.

When the method of reducing photoelectric device leakage current caused by residual metal ions in conjugated polymer is practiced, a conjugated polymer composition used in photoelectric device and comprising a conjugated polymer or a precursor thereof, and a chelating agent in an amount of from 0.01 to 50 wt % based on the weight of the conjugated polymer material or the precursor thereof is obtained. The definition of conjugated polymer or precursors and chelating agents and the application of the resulting compositions are as same as the description mentioned above. The conjugated polymer composition of the present invention can further include a solvent for forming a commercial product in solution form.

EXAMPLES

Preparation 1

Conjugated polymer poly(2,3-dibutoxy-1,4-phenylene vinylene) (herein referred to as DB-PPV) was dissolved in dehydrated anisole in a concentration of 2.5 mg/cc under $N_2$. The resulting solution was divided into four parts for the use in Comparative Example 1 and Examples 1 to 3. The molecular weight of the DB-PPV was about 860,000, and the distribution of molecular weight was 4.2. The metal ions and the amounts thereof contained in the DB-PPV are shown in Table 1.

TABLE 1

Metal ions and amounts thereof in the DB-PPV

| Ion | Amount of ion (ppm) |
|---|---|
| Na | 23.6 |
| Mg | 13.1 |
| Al | 43.5 |
| K | 1238.0 |
| Ca | 128.8 |
| Cr | 2.8 |
| Mn | 1.2 |
| Fe | 65.9 |
| Co | 1.4 |
| Ni | 6.4 |
| Cu | 11.2 |
| Ba | 1.1 |
| Pb | 4.2 |
| Total content | 1541 |

Comparative Example 1

Figure 1:
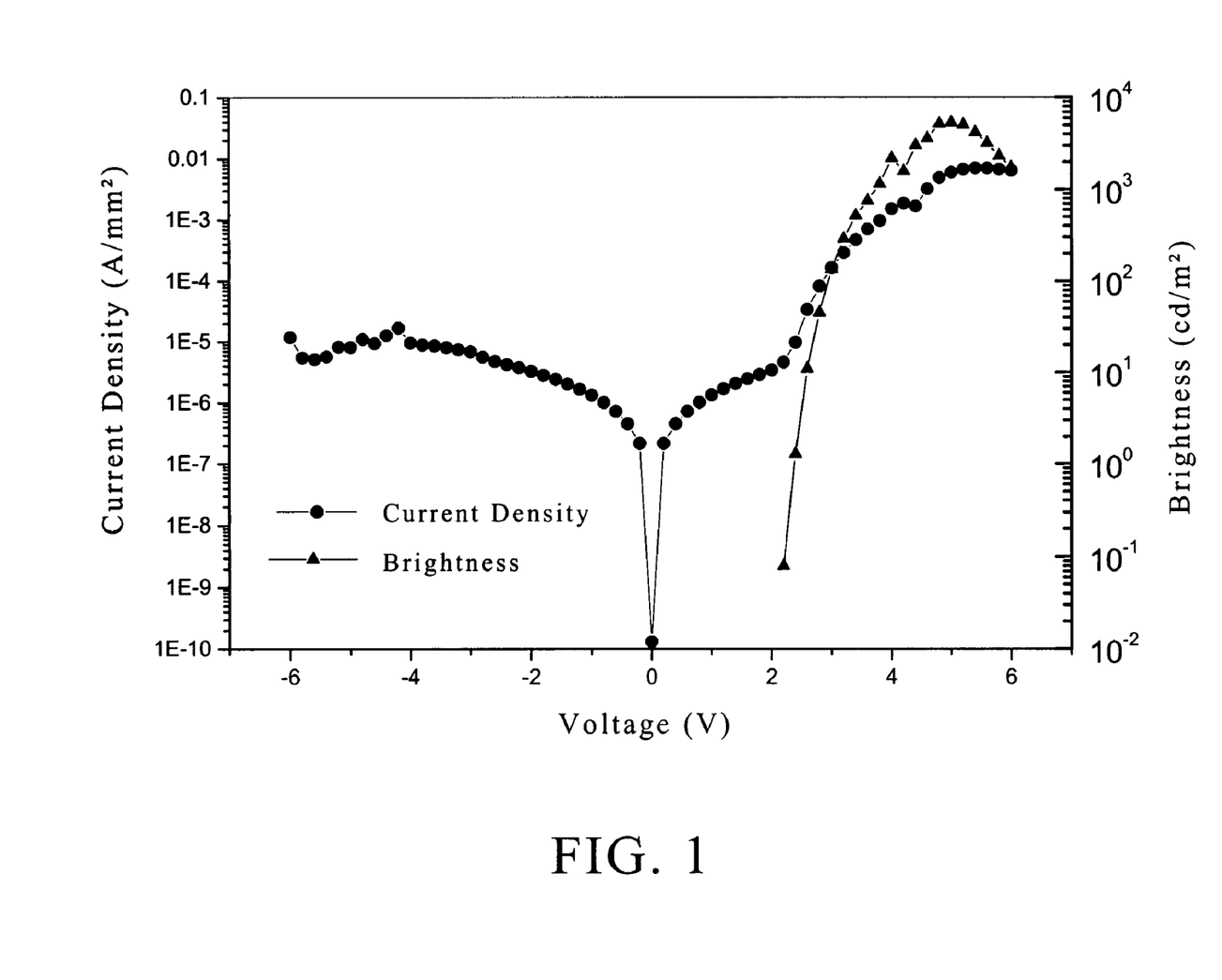
FIGS. 1 to 4 are plots of current density and brightness against voltage for the devices obtained from Comparative Example 1 and Examples 1 to 3 of the present invention, respectively.

PEDOT was spin-coated on a clean ITO (indium tin oxide) glass sheet to form a layer of hole transferring material with a thickness of 60 nm. The DB-PPV solution obtained from Preparation 1 was spin-coated on the PEDOT layer at 2000 rpm to form an electroluminescent layer with a thickness of 50 nm. The resultant was placed in a vacuum chamber and vacuumed to a pressure of $10^{-6}$ Torr, and then, a calcium layer as a cathode with a thickness of 50 nm was vapor-deposited over the electroluminescent layer. An aluminum layer as a protective layer was vapor-deposited over the cathode, and a device was accomplished. The photoelectric properties of the device were tested to obtain FIG. 1 showing the relations among current, voltage, and brightness.

Example 1

Figure 2:
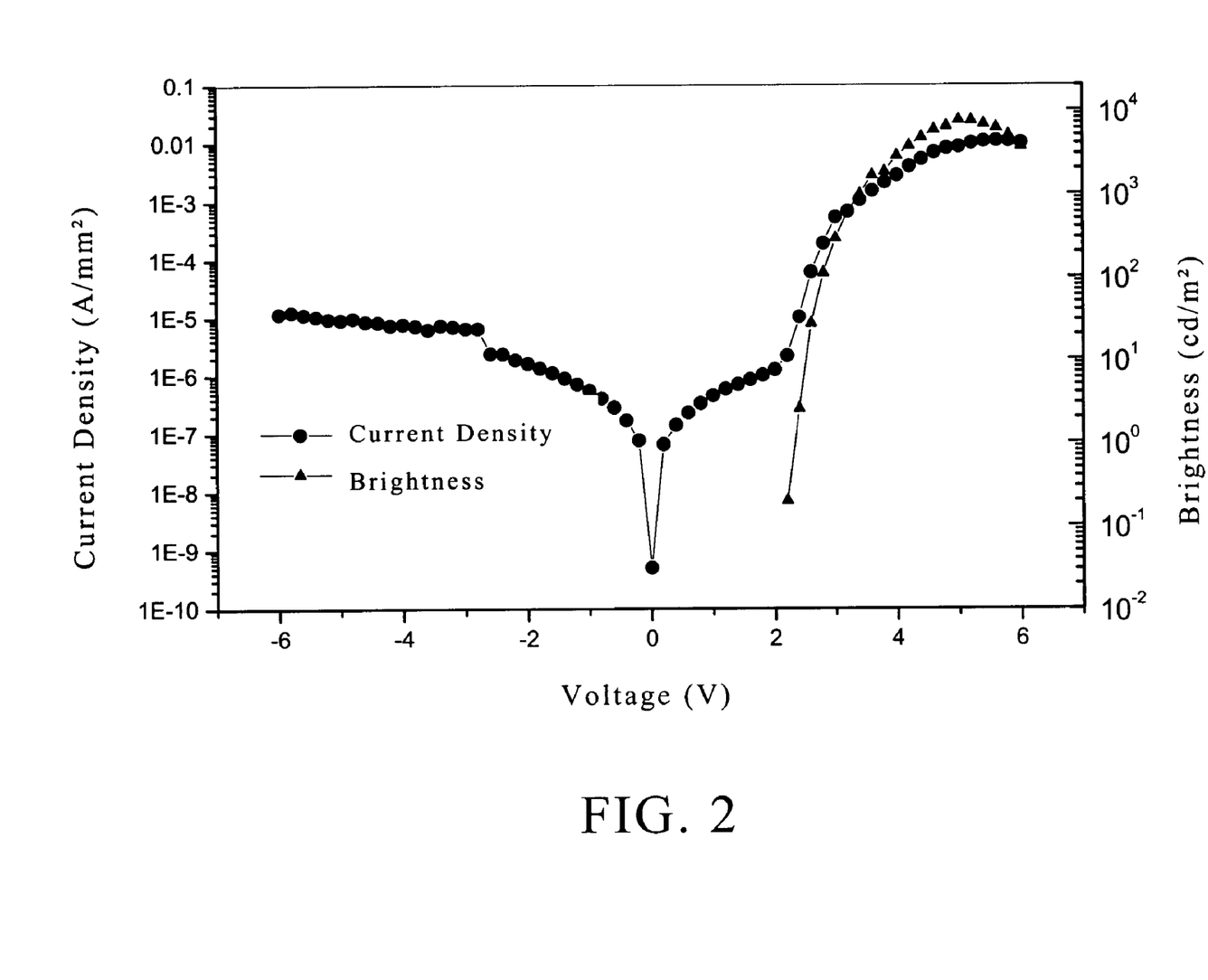

18-crown-6 as a chelating agent was added to the DB-PPV obtained from Preparation 1 in an amount of 5 wt % based on the weight of the DB-PPV polymer. PEDOT was spin-coated on a clean ITO glass sheet to form a layer of hole transferring material with a thickness of 60 nm. The DB-PPV solution containing the chelating agent was spin-coated on the PEDOT layer at 2000 rpm to form an electroluminescent layer with a thickness of 50 nm. The resultant was placed in a vacuum chamber and vacuumed to a pressure of $10^{-6}$ Torr, and then, a calcium layer as a cathode with a thickness of 50 nm was vapor-deposited over the electroluminescent layer. An aluminum layer as a protective layer was vapor-deposited over the cathode, and a device was accomplished. The photoelectric properties of the device were tested to obtain FIG. 2 showing the relations among current, voltage, and brightness.

Example 2

Example 2 was performed using the method same as Example 1, provided that 8-hydroxyquinoline was used as the chelating is agent instead of 18-crown-6. The photoelectric properties of the resulting device were tested to obtain FIG. 3.

Example 3

Example 3 was performed using the method same as Example 1, provided that tetraethylthiuram disulfide was used as the chelating agent instead of 18-crown-6. The photoelectric properties of the resulting device were tested to obtain FIG. 4.

Preparation 2

DB-PPV having a lower content of metal ions than that used in Preparation 1 was used as the conjugated polymer and dissolved in dehydrated toluene in a concentration of 5 mg/cc under $N_2$. The resulting solution was divided into three parts for the use in Comparative Example 2 and Examples 4 and 5. The molecular weight of the DB-PPV was about 860,000, and the distribution of molecular weight was 4.2. The metal ions and amounts thereof contained in the DB-PPV are shown in Table 2.

TABLE 2

Metal ions and amounts thereof in the DB-PPV used in Preparation 2

| Ion | Content of ion (ppm) |
|---|---|
| Na | 4.7 |
| Mg | 12.9 |

TABLE 2-continued

Metal ions and amounts thereof in the DB-PPV used in Preparation 2

| Ion | Content of ion (ppm) |
|---|---|
| Al | 10.6 |
| K | 44.7 |
| Ca | 104.9 |
| Mn | 1.3 |
| Fe | 9.7 |
| Ni | 0.8 |
| Cu | 0.7 |
| Total content | 190 |

Comparative Example 2

Figure 6:
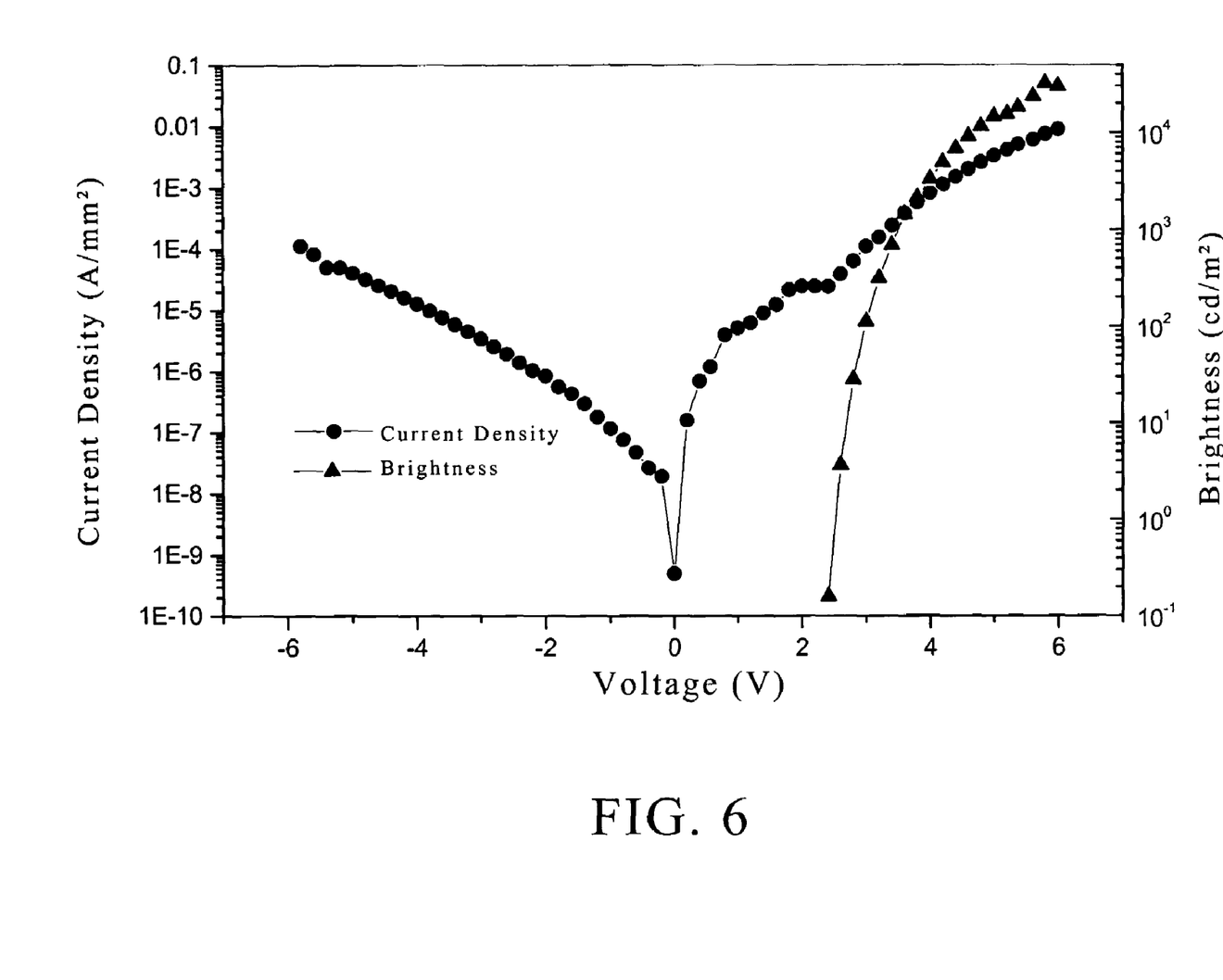
FIGS. 6 to 8 are plots of current density and brightness against voltage for the devices obtained from Comparative Example 2 and Examples 4 and 5 of the present invention, respectively.

PEDOT was spin-coated on a clean ITO glass sheet to form a layer of hole transferring material with a thickness of 60 nm. The DB-PPV solution obtained from Preparation 2 was spin-coated on the PEDOT layer at 1500 rpm and then heated on a heating plate at 70° C. for 40 minutes, forming an electroluminescent layer. The resultant was placed in a vacuum chamber and vacuumed to a pressure of $10^{-6}$ Torr, and then, a calcium layer as a cathode with a thickness of 50 nm is was vapor-deposited over the electroluminescent layer. An aluminum layer as a protective layer was vapor-deposited over the cathode, and a device was accomplished. The photoelectric properties of the device were tested to obtain FIG. 6 showing the relations among current, voltage, and brightness.

Example 4

8-hydroxyquinoline as a chelating agent was added to the DB-PPV obtained from Preparation 1 in an amount of 5 wt % based on the weight of the DB-PPV polymer. PEDOT was spin-coated on a clean ITO glass sheet to form a hole transferring layer with a thickness of 60 nm. The DB-PPV solution containing 8-hydroxyquinoline was spin-coated on the PEDOT layer at 1500 rpm and then heated on a heating plate at 70° C. for 40 minutes, forming an electroluminescent layer. The resultant was placed in a vacuum chamber and vacuumed to a pressure of $10^{-6}$ Torr, and then, a calcium layer as a cathode with a thickness of 50 nm was vapor-deposited over the electroluminescent layer. An aluminum layer as a protective layer was vapor-deposited over the cathode, and a device was accomplished. The photoelectric properties of the device were tested to obtain FIG. 7 showing the relations among current, voltage, and brightness.

Example 5

Example 5 was performed using the method same as Example 4, provided that N,N'-bis(salicylidene)ethylenediamine was used as the chelating agent instead of 8-hydroxyquinoline. The photoelectric properties of the resulting device were tested to obtain FIG. 8.

Figure 3:
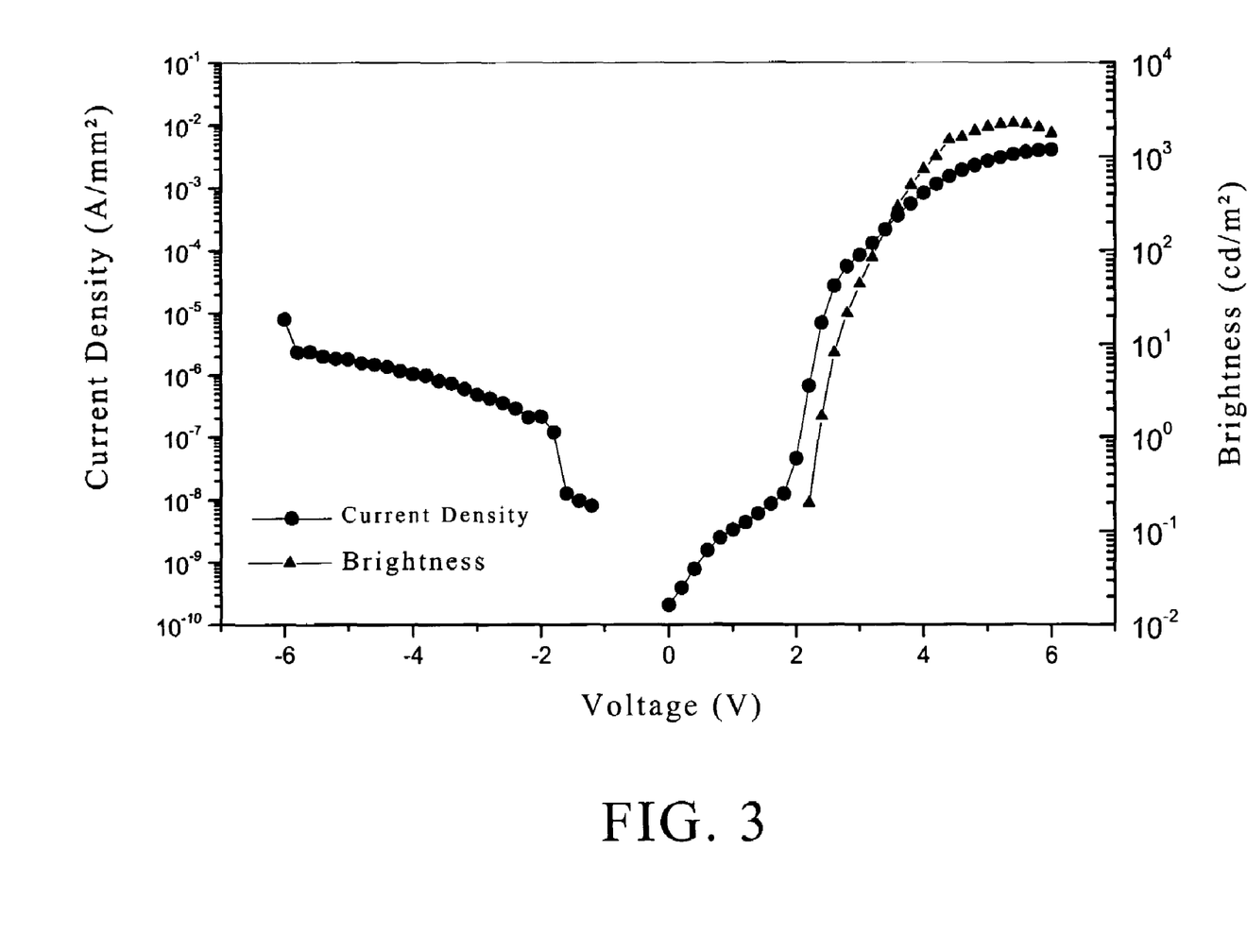
Figure 4:
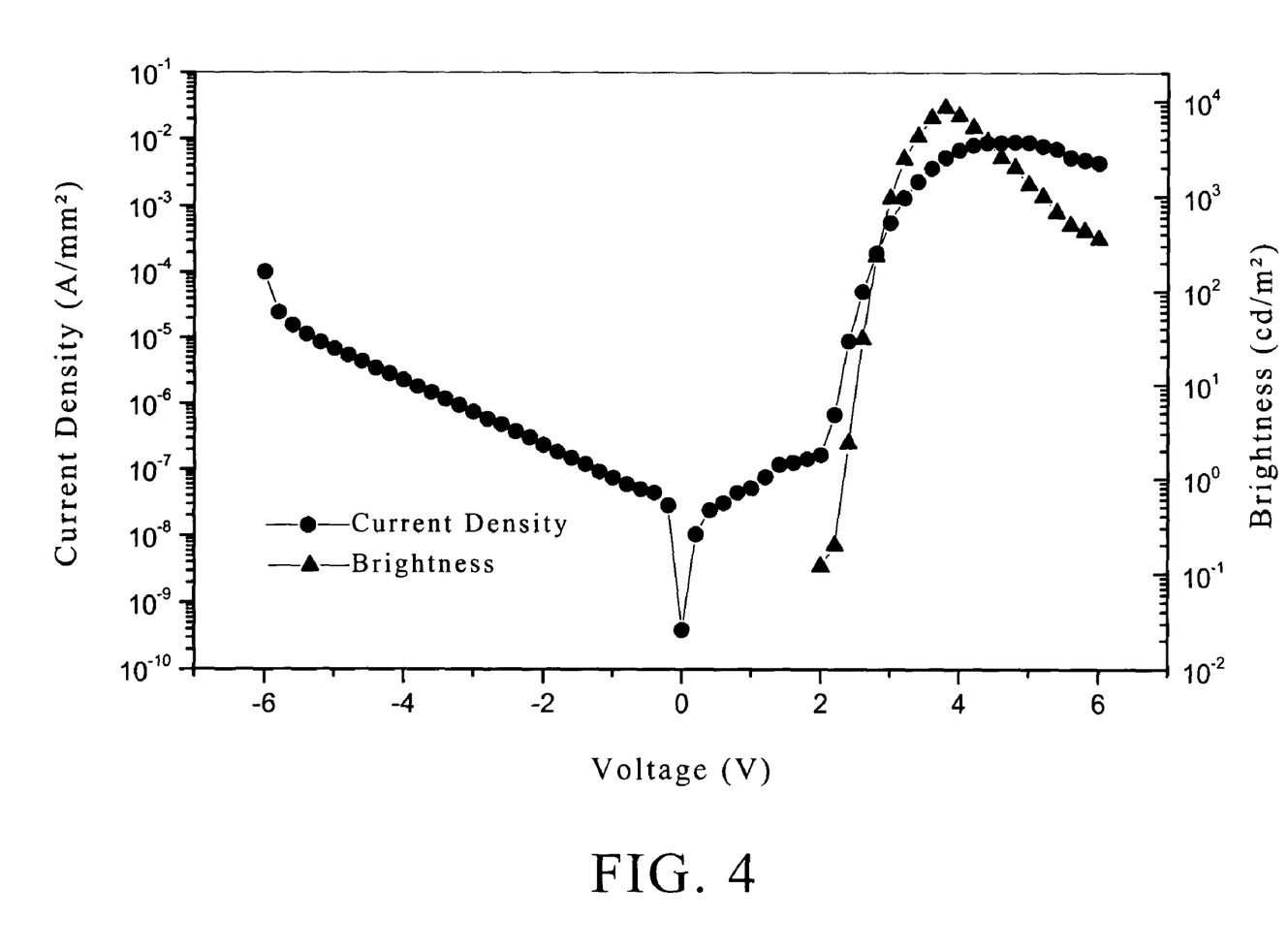
Figure 7:
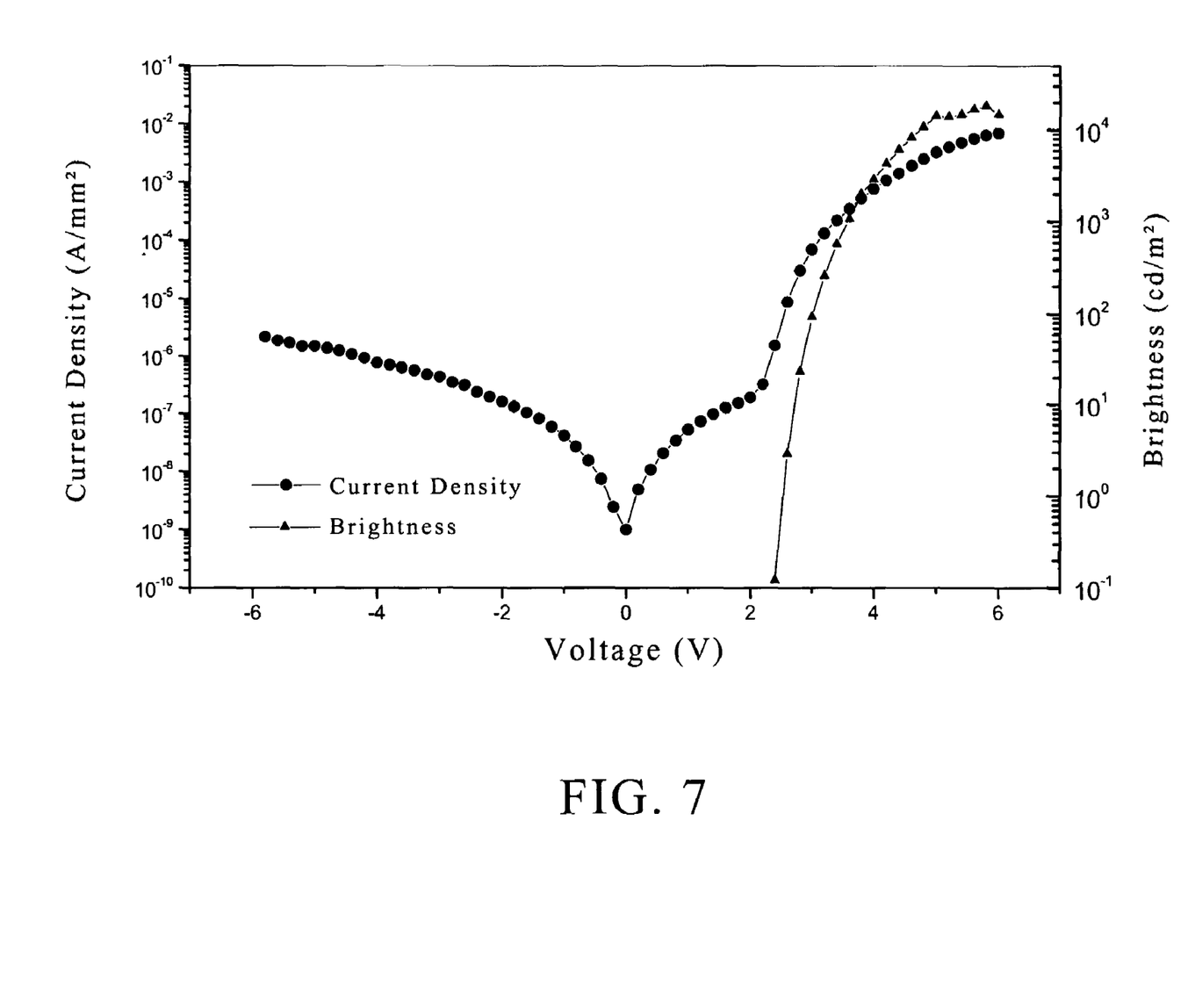
Figure 8:
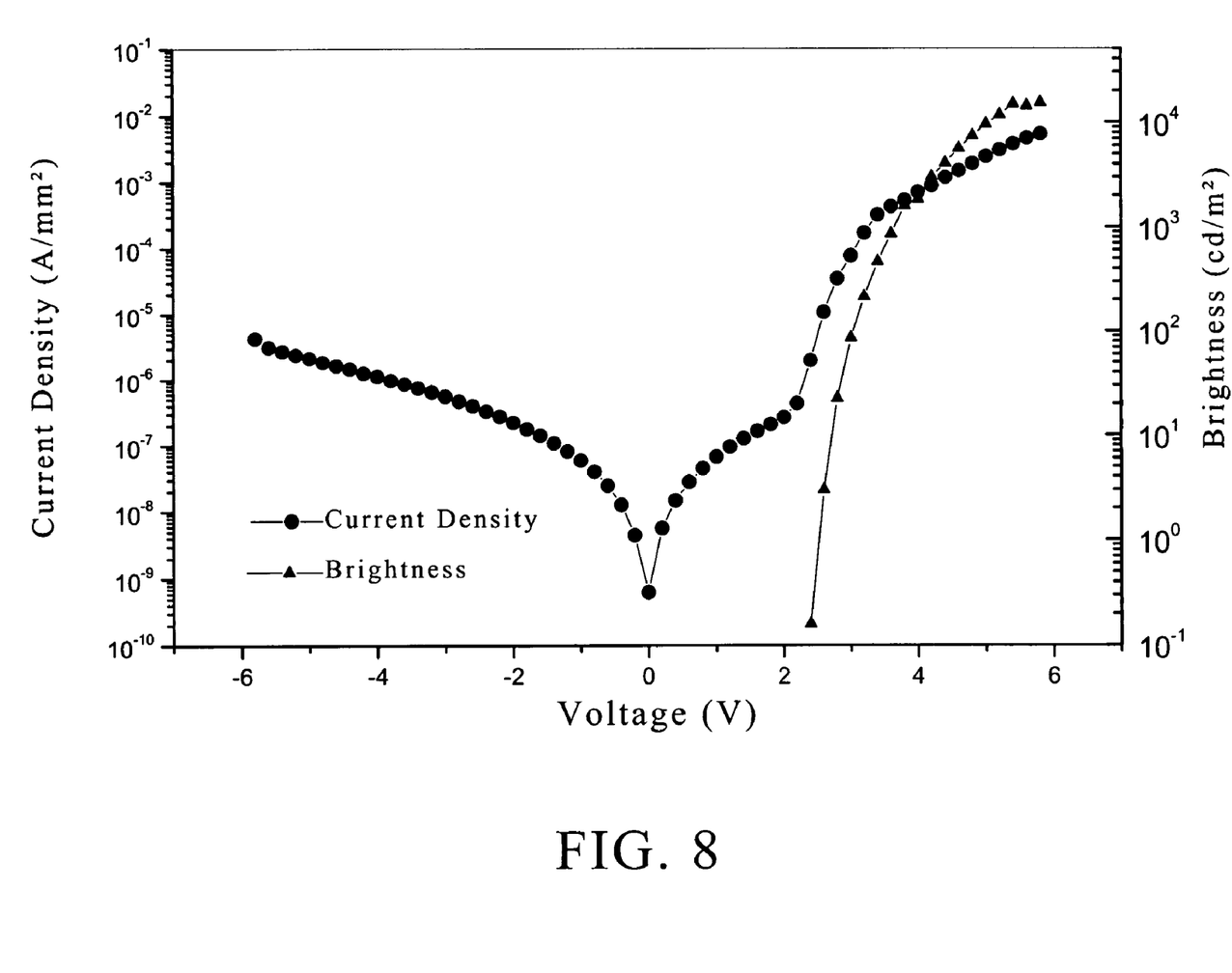

FIGS. 1 to 4 and FIGS. 6 to 8 show the relations among current, voltage, and brightness. FIGS. 1 to 4 show the plots of current density against positive and negative bias voltage and brightness against positive and negative bias voltage for the devices having the structure of ITO/PEDOT/DB-PPV/Ca/Al, wherein, FIGS. 2 to 4 are the results of the same devices provided that the DB-PPV solution containing 5 wt % of various chelating agent is used, and FIG. 1 is the result of the comparative example without the addition of a chelating agent. As known from the Figures, all the devices of the present invention have less initial current density, as well as less parasitic current generated by negative bias voltage, than those of the comparative example, besides, the brightness is not adversely affected by the addition of chelating agents. FIGS. 6 to 8 show the same effect as the addition of chelating agents on the devices obtained from Comparative Example 2 (without the addition of chelating agents) and Examples 4 and 5 (with the addition of chelating agents), that the initial current density and the parasitic current generated by negative bias voltage are both obviously reduced and the brightness is not adversely affected.

Figure 5:
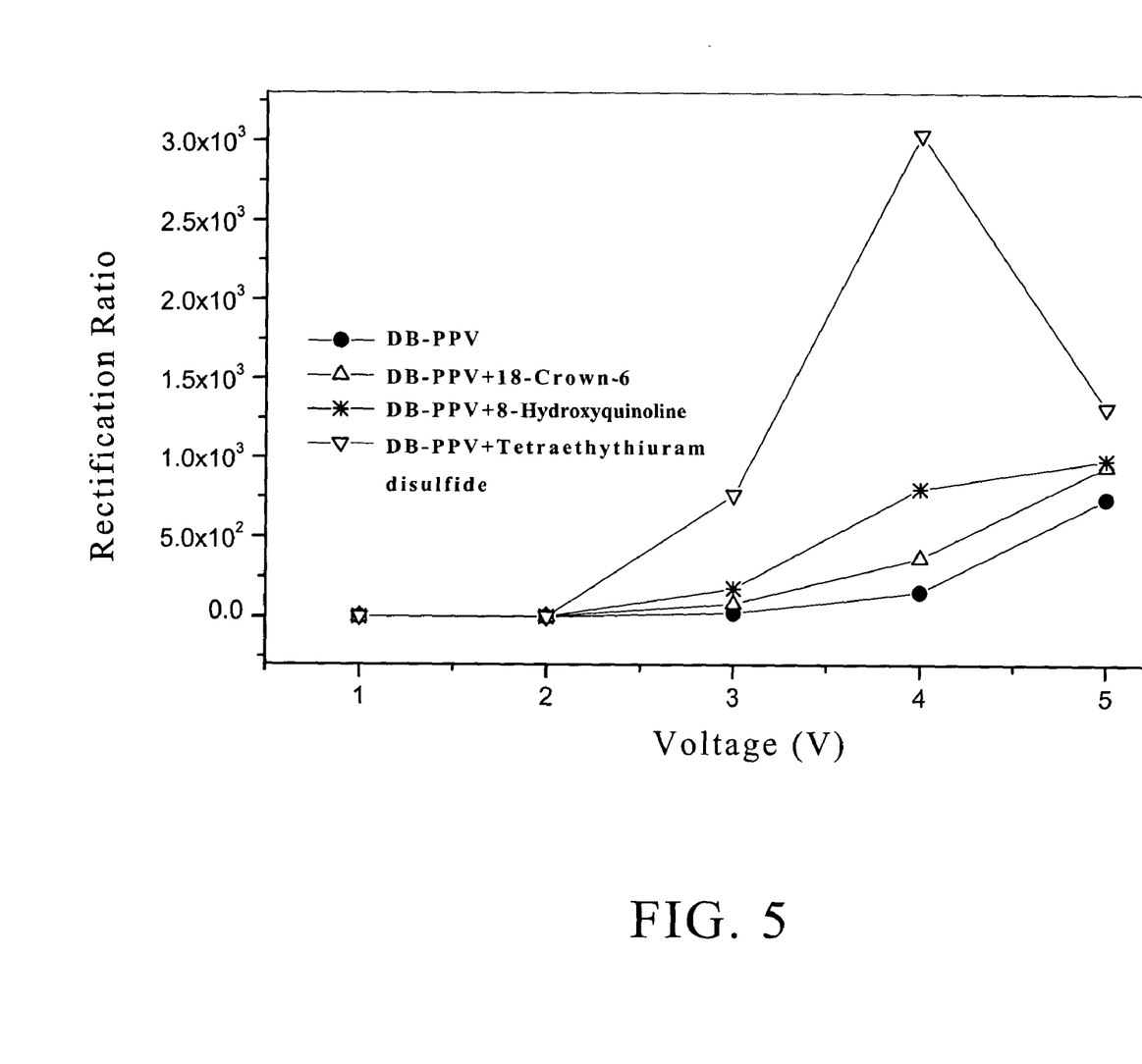
FIG. 5 is a plot of rectification ratio against voltage for the four devices obtained from Comparative Example 1 and Examples 1 to 3 of the present invention.

FIG. 5 shows the rectification ratio of the four devices obtained from Comparative Example 1 and Examples 1 to 3. It is found that the devices obtained through the method of the present invention have obviously higher rectification ratios than that of the conventional device without the addition of chelating agents. This also demonstrates that the addition of chelating agents can reduce the leakage current in the conjugated polymer device.

Figure 9:
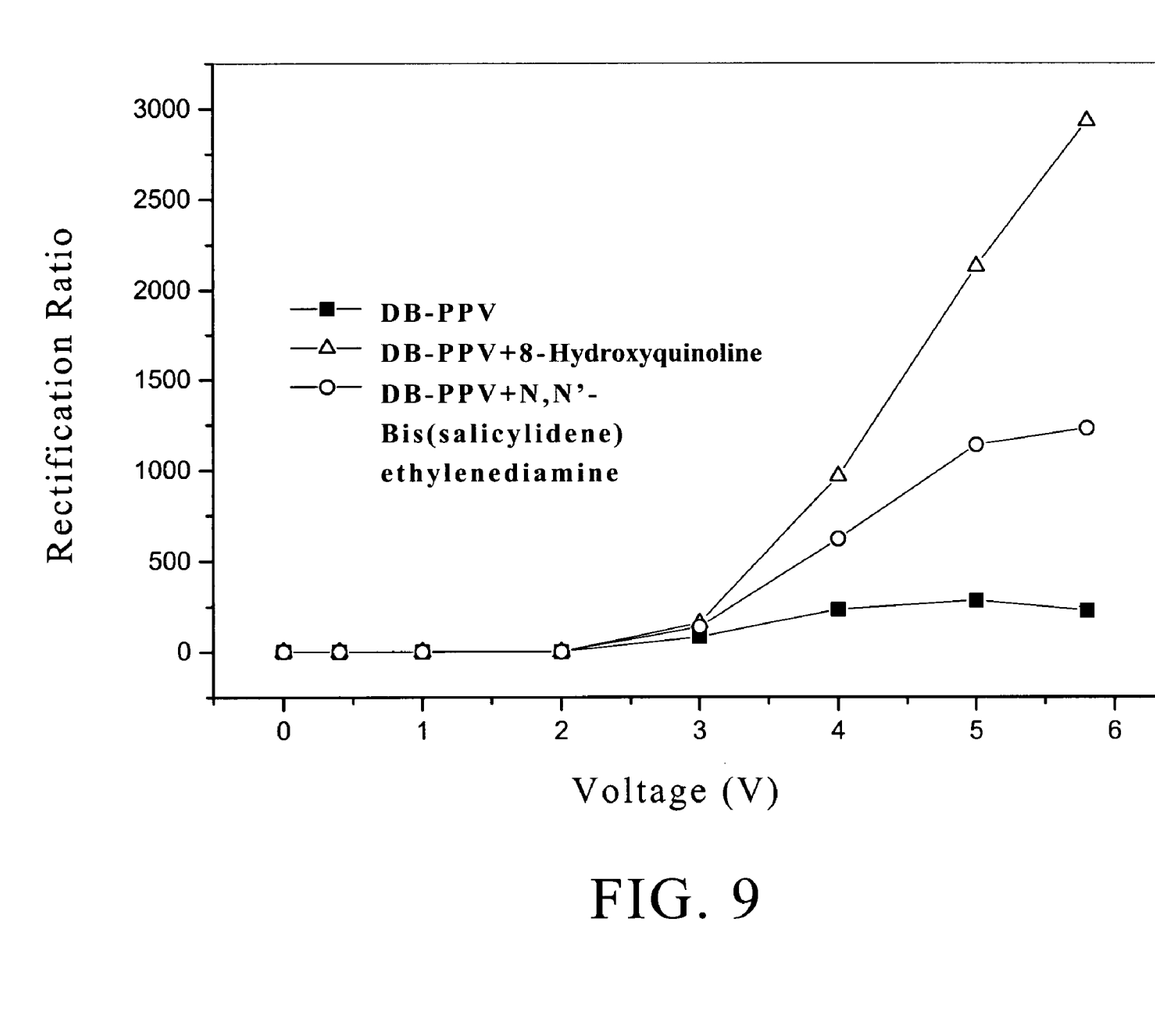
FIG. 9 is a plot of rectification ratio against voltage for the three devices obtained from Comparative Example 2 and Examples 4 and 5 of the present invention.

FIG. 9 shows the rectification ratio of the three devices obtained from Comparative Example 2 and Examples 4 and 5. The effect of chelating agents can be demonstrated by the increased rectification ratios of the devices obtained from Examples 4 and 5, compared to Comparative Example 2.

Preparation 3

Conjugated polymer poly(9,9-dioctylfluorene) (herein referred to as PF) was dissolved in dehydrated anisole in a concentration of 20 mg/cc under $N_2$. The resulting solution was divided into four parts for use in the Comparative Example 3 and Examples 6 to 8. The molecular weight of the PF was 36,000, and the contained metal ions therein and amounts thereof are shown in Table 3.

TABLE 3

Metal ions and amounts thereof in the PF

| Ion | Amount of Ion (ppm) |
|---|---|
| Na | 2.9 |
| Mg | 20.8 |
| Al | 14.0 |
| K | 3.2 |
| Ca | 39.4 |
| Fe | 6.5 |
| Total content | 87 |

Comparative Example 3

PEDOT was spin-coated on a clean ITO glass sheet to form a hole transferring layer with a thickness of 60 nm. The PF solution obtained from Preparation 3 was spin-coated on the PEDOT layer at 3000 rpm and then heated on a heating plate at 70° C. for 40 minutes, forming an electroluminescent layer with a thickness of 40 nm. The resultant was placed in a vacuum chamber and vacuumed to a pressure of $10^{-6}$ Torr, and then, a calcium layer as a cathode with a thickness of 50 nm was vapor-deposited over the electroluminescent layer. An aluminum layer as a protective layer was vapor-deposited over the cathode, and a device was accomplished. The photoelectric properties of the device were tested.

Example 6

8-hydroxyquinoline as a chelating agent was added to the PF obtained from Preparation 3 in an amount of 1 wt % based on the weight of the PF polymer. PEDOT was spin-coated on a clean ITO glass sheet to form a hole transferring layer with a thickness of 60 nm. The PF solution containing the 8-hydroxyquinoline was spin-coated on the PEDOT layer at 3000 rpm to form an electroluminescent layer with a thickness of 40 nm. The resultant was placed in a vacuum chamber and vacuumed to a pressure of $10^{-6}$ Torr, and then, a calcium layer as a cathode with a thickness of 50 nm was vapor-deposited over the electroluminescent layer. An aluminum layer as a protective layer was vapor-deposited over the cathode, and a device was accomplished. The photoelectric properties of the device were tested.

Example 7

Example 7 was performed using the method same as Example 6, provided that tetraethylthiuram disulfide was used as the chelating agent instead of 8-hydroxyquinoline. The photoelectric properties of the resulting device were tested.

Example 8

Example 8 was performed using the method same as Example 6, provided that N,N'-bis(salicylidene)ethylenediamine was used as the chelating agent instead of 8-hydroxyquinoline. The photoelectric properties of the resulting device were tested.

Figure 10:
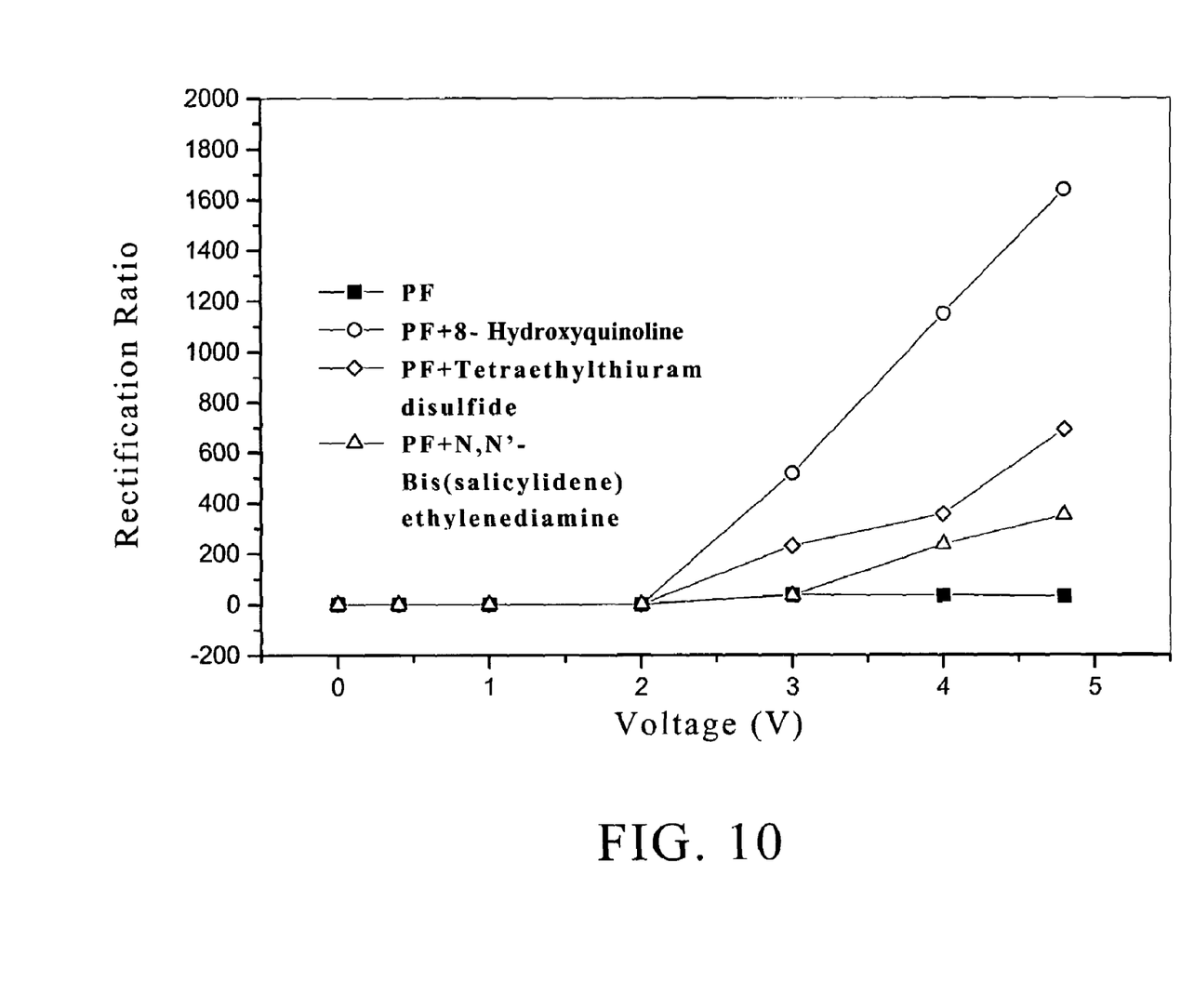
FIG. 10 is a plot of rectification ratio against voltage for the four devices obtained from Comparative Example 3 and Examples 6 to 8 of the present invention.

FIG. 10 shows the rectification ratios of the four devices obtained from Comparative Example 3 and Examples 6 to 8. The effect of chelating agents can be demonstrated by the increased rectification ratios of the devices obtained from Examples 6 to 8, compared to Comparative Example 3.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of reducing photoelectric device leakage current caused by residual metal ions in conjugated polymer, comprising the steps of:
   (i) providing a conjugated polymer material or a precursor thereof for a photoelectric device;
   (ii) forming a solution containing the conjugated polymer material or the precursor thereof;
   (iii) adding a chelating agent into the solution such that the residual metal ions in the conjugated polymer material or the precursor thereof are chelated by the chelating agent, in an amount of from 0.01 to 50% based on the weight of the conjugated polymer material or the precursor thereof; and
   (iv) forming the solution obtained from step (iii) into a film for the photoelectric device.

2. The method as claimed in claim 1, wherein the conjugated polymer material or the precursor thereof is an organic light emitting polymer material, an electron transferring polymer material, or a hole transferring polymer material.

3. The method as claimed in claim 2, wherein the conjugated polymer material is selected from the group consisting of polyphenylene vinylene, polyfluorene, derivatives thereof, precursors thereof, and combinations thereof.

4. The method as claimed in claim 3, wherein the conjugated polymer material is poly(2,3-dibutoxy-1,4-phenylene vinylene), poly(9,9-dioctylfluorene), or a precursor thereof.

5. The method as claimed in claim 1, wherein the chelating agent is selected from the group consisting of aminophenols, sulfur compounds, crown ethers, salicylimines, and combinations thereof.

6. The method as claimed in claim 5, wherein the chelating agent is selected from the group consisting of 8-hydroxyquinoline, oxinesulfonic acid, tetraethylthiuram disulfide, tetramethylthiuram disulfide, dithiol, 2,3-dimercaptopropanol, thioglycolic acid, potassium ethyl xanthate, sodium diethyldithiocarbamate, dithizone, diethyldithiophosphoric acid, thiourea, 12-crown-4, 15-crown-5, 18-crown-6, dibenzo-18-crown-6, N,N'-bis(salicylidene) ethylenediamine, and combinations thereof.

7. The method as claimed in claim 6, wherein the chelating agent is 18-crown-6, 8-hydroxyquinoline, tetraethylthiuram disulfide, or N,N'-bis(salicylidene)ethylenediamine.

8. The method as claimed in claim 1, wherein the film is used in organic light emitting diode devices, organic solar cell devices, organic transistor devices, organic laser devices, organic memory devices, organic resistor devices, organic capacitor devices, or organic inductor devices.

* * * * *